United States Patent
Liao et al.

(10) Patent No.: US 7,423,321 B2
(45) Date of Patent: Sep. 9, 2008

(54) DOUBLE GATE MOSFET DEVICE

(75) Inventors: Wen-Shiang Liao, Miao-Li (TW); Wei-Tsun Shiau, Kaohsiung (TW)

(73) Assignee: United Microelectronics Corp., Hsin-Chu (TW)

( * ) Notice: Subject to any disclaimer, the term of this patent is extended or adjusted under 35 U.S.C. 154(b) by 72 days.

(21) Appl. No.: 10/976,278

(22) Filed: Oct. 29, 2004

(65) Prior Publication Data

US 2005/0087811 A1   Apr. 28, 2005

Related U.S. Application Data

(62) Division of application No. 10/679,381, filed on Oct. 7, 2003, now Pat. No. 6,855,588.

(51) Int. Cl.
*H01L 27/01* (2006.01)

(52) U.S. Cl. ............... 257/347; 257/349; 257/E29.049

(58) Field of Classification Search ............... 257/900, 257/907, 347–350, 368, 353, 392–393, 397, 257/270, 618, E29.049, E29.067, E29.26, 257/E29.237
See application file for complete search history.

(56) References Cited

U.S. PATENT DOCUMENTS

| | | | | |
|---|---|---|---|---|
| 6,316,813 B1 * | 11/2001 | Ohmi et al. | ............... | 257/401 |
| 6,413,802 B1 * | 7/2002 | Hu et al. | ............... | 438/151 |
| 6,432,829 B2 * | 8/2002 | Muller et al. | ............... | 438/694 |
| 6,770,516 B2 * | 8/2004 | Wu et al. | ............... | 438/154 |
| 6,787,406 B1 * | 9/2004 | Hill et al. | ............... | 438/164 |
| 6,800,885 B1 * | 10/2004 | An et al. | ............... | 257/347 |
| 6,800,910 B2 * | 10/2004 | Lin et al. | ............... | 257/410 |
| 6,812,075 B2 * | 11/2004 | Fried et al. | ............... | 438/157 |
| 6,833,556 B2 * | 12/2004 | Grupp et al. | ............... | 257/24 |
| 6,844,238 B2 * | 1/2005 | Yeo et al. | ............... | 438/424 |
| 6,858,478 B2 * | 2/2005 | Chau et al. | ............... | 438/149 |
| 6,885,055 B2 * | 4/2005 | Lee | ............... | 257/308 |
| 6,909,151 B2 * | 6/2005 | Hareland et al. | ............... | 257/369 |
| 6,911,358 B2 * | 6/2005 | Azami et al. | ............... | 438/150 |
| 6,992,354 B2 * | 1/2006 | Nowak et al. | ............... | 257/347 |
| 7,074,656 B2 * | 7/2006 | Yeo et al. | ............... | 438/157 |
| 2002/0011612 A1 * | 1/2002 | Hieda | ............... | 257/262 |

* cited by examiner

*Primary Examiner*—Howard Weiss
*Assistant Examiner*—Hoa B Trinh
(74) *Attorney, Agent, or Firm*—Harold L. Novick; The Nath Law Group

(57) ABSTRACT

A method of fabricating a double gate MOSFET device is provided. The present invention overetches a silicon layer overlying a buried oxide layer using a hard mask of cap oxide on the silicon layer as an etching mask. As a result, source, drain and channel regions are formed extending from the buried oxide layer, and a pair of recesses are formed under the channel regions in the buried oxide layer. The channel is a fin structure with a top surface and two opposing parallelly sidewalls. The bottom recess is formed under each opposing sidewall of the fin structure. A conductive gate layer is formed straddling the fin structures. The topography of the conductive gate layer significantly deviates from the conventional plainer profile due to the bottom recess structures under the channel regions, and a more uniformly distributed doped conductive gate layer can be obtained. Hence, the depletion effect of the conductive polysilicon gate while operating the device can be suppressed and the device drive-on currents can be further enhanced.

4 Claims, 9 Drawing Sheets ns and PMOS can be subsequently proceeded. Referring to FIG. 1D, the hard mask of the silicon

DOUBLE GATE MOSFET DEVICE

CROSS REFERENCE TO RELATED APPLICATION

This application is a division of U.S. patent application Ser. No. 10/679,381, filed Oct. 7, 2003 now U.S. Pat. No. 6,855, 588.

BACKGROUND OF THE INVENTION

1. Field of the Invention

The present invention relates to a method for fabricating a FinFET transistor device, and more particularly to a method of fabricating a double gate MOSFET with a capability of inhibiting the depletion effect of the conductive gate while operating this device, which can hence elevate the device drive-on currents.

2. Description of the Prior Art

In the past several years, significant progress has been made for the scaling of classical planar MOSFET (metal-oxide-semiconductor field effect transistor) structure to the gate lengths below 65 nm. Despite difficulties in fabrication, sub-20 nm physical gate length MOSFETs have recently been demonstrated. However, further scaling of the planar structure below 50 nm becomes increasingly challenging due to excess leakage, degradation in mobility, and a variety of difficulties within the device processing. Therefore, alternative MOSFET structures and new process technologies need to be explored. The effective control of leakage in nano-scale transistors will be extremely important for high-performance densely packed chips such as microprocessors.

The double gate MOSFET, featuring excellent short-channel behavior and relaxed requirements for aggressive scaling of gate dielectrics and junction depths, is attractive for high-performance low power applications. Fully-depleted vertical double gate devices with symmetric gate structures feature a low vertical electrical field in the channel which is favorable to carrier transport. The FinFET is a promising vertical double gate structure, which has been demonstrated in the last few years at gate lengths ranging from 100 nm to 10 nm. Unlike other reported vertical double gate structures, the FinFET can be fabricated with minimal deviation from the industry standard CMOS process.

The FinFET transistors were fabricated on SOI (silicon-on-insulator) wafers with a modified planar CMOS process. FIG. 1A to FIG. 1F is an illustration of the general process flow for fabricating the FinFET transistor. At first, referring to FIG. 1A, a substrate such as a silicon on insulator (SOI) structure is provided, including a silicon substrate 10, a buried oxide layer (BOX) 11 and a silicon layer 12 on the buried oxide layer 11. A cap oxide layer 13 was thermally grown on the silicon layer 12 to relieve the stress between the ensuing nitride hard mask and the silicon layer 12. A silicon nitride layer 14 was deposited on the cap oxide layer 13, to serve as a hard mask.

After the hard mask deposition, a photoresistor 15 is applied to define the hard mask through use of optical lithography, electron beam lithography, X-ray lithography, or other conventional means to produce a chemical etchant mask. Then, referring to FIG. 1B, after the mask definition, an etch process is used to pattern the hard mask and the device fin structure including a silicon drain region (not shown) and a silicon source region (not shown) connected by a silicon fin or channel 12, and thereafter the photoresistor 15 is removed. Referring to FIG. 1C, a thin sacrificial oxidation process maybe used to form a sacrificial oxide 16 on the two parallelly opposing sidewalls of the silicon fin 12 to repair any damage done to the fin surface during the etch process. Oxidation may also be used to reduce the fin width, thereby allowing sub-lithography dimensions to be achieved. The threshold ($V_t$) implants of NMOS and PMOS can be subsequently proceeded. Referring to FIG. 1D, the hard mask of the silicon nitride layer 14 and the thin sacrificial oxide 16 are removed to retain the cap oxide layer 13 on the silicon fin 12. Referring to FIG. 1E, a gate oxide 17 is grown or deposited on the two opposing sidewalls of the silicon fin 12. Then, referring to FIG. 1F, a polysilicon gate material is deposited over the surface of the silicon fin 12, a gate mask is defined on the polysilicon gate material and then the underlying gate material is etched to form a polysilicon gate 18 with the etching stopping on the cap oxide 13 and the buried oxide layer 11. An ion implantation process is performed to implant dopants in the polysilicon gate 18 for a desired threshold voltage $V_{th}$. Referring to FIG. 2, the source/drain regions 12A and 12B are also doped to make them electrically conductive electrodes in the subsequent source/drain ion implantations. Referring to FIG. 1F again, however, the distribution of the dopants in the polysilicon gate 18 is a gaussian distribution along the depth of the polysilicon gate 18. The .portions of the polysilicon gate 18 nearby the bottom corners contained between the gate oxide 17 and the buried oxide layer 11 would have been more lightly doped, and have a larger resistance. Furthermore, upon operating the FinFET transistor, a depletion of the polysilicon gate 18 easily occurs, which in turn thickens the equivalent oxide thickness (EOT) of the gate dielectric 17, resulting in the reduction of the drive current of the FinFET transistor.

Accordingly, it is an intention to provide a method of fabricating a FinFET transistor device, which can alleviate the problem encountered in the conventional process for fabricating the FinFET transistor.

SUMMARY OF THE INVENTION

It is one objective of the present invention to provide a method of fabricating a double gate MOSFET device, which can prevent depletion of a polysilicon gate by improving the distributed uniformity of dopants in the polysilicon gate.

It is another objective of the present invention to provide a method of fabricating a double gate MOSFET device, which reduces the short channel effect and has a better gate control.

In order to achieve the above objectives, the present invention provides a method of fabricating a double gate MOSFET device. A silicon on insulator (SOI) substrate with a silicon layer overlying an insulating layer is provided. A cap oxide layer is formed on the silicon on insulator (SOI) substrate. A photoresistor layer with a pattern defining source, drain and channel regions is provided on the cap oxide layer. Etching the cap oxide layer to form a hard mask, and removing the photoresistor layer. Using the hard mask of the cap oxide layer as an etching mask, over-etching the silicon layer to form source, drain and channel regions extending from the insulating layer. The channel is a fin structure with a top surface and two opposing sidewalls, and a recess formed in the insulating layer under each opposing sidewall of the fin structure. A gate dielectric layer is formed along each opposing sidewall, and a conductive gate layer is formed straddling the fin structures. Performing a titled ion implantation to implant dopants in the conductive gate layer, thereby the conductive gate layer having a first conductivity.

The recess structures under the channel regions make the topography of the conductive gate layer significantly deviating from a plain profile. As a consequence, a more uniformly distributed doped conductive gate layer can be obtained by performing the titled ion implantation due to the topography of the conductive gate layer. A gate depletion phenomenon is thus prevented upon operating the double gate MOSFET device. Furthermore, an excellent short channel behavior and a better gate control are achieved by the double gate structure of the present invention.

BRIEF DESCRIPTION OF THE DRAWINGS

The objectives and features of the present invention as well as advantages thereof will become apparent from the following detailed description, considered in conjunction with the accompanying drawings.

DESCRIPTION OF THE PREFERRED EMBODIMENTS

Figure 4:
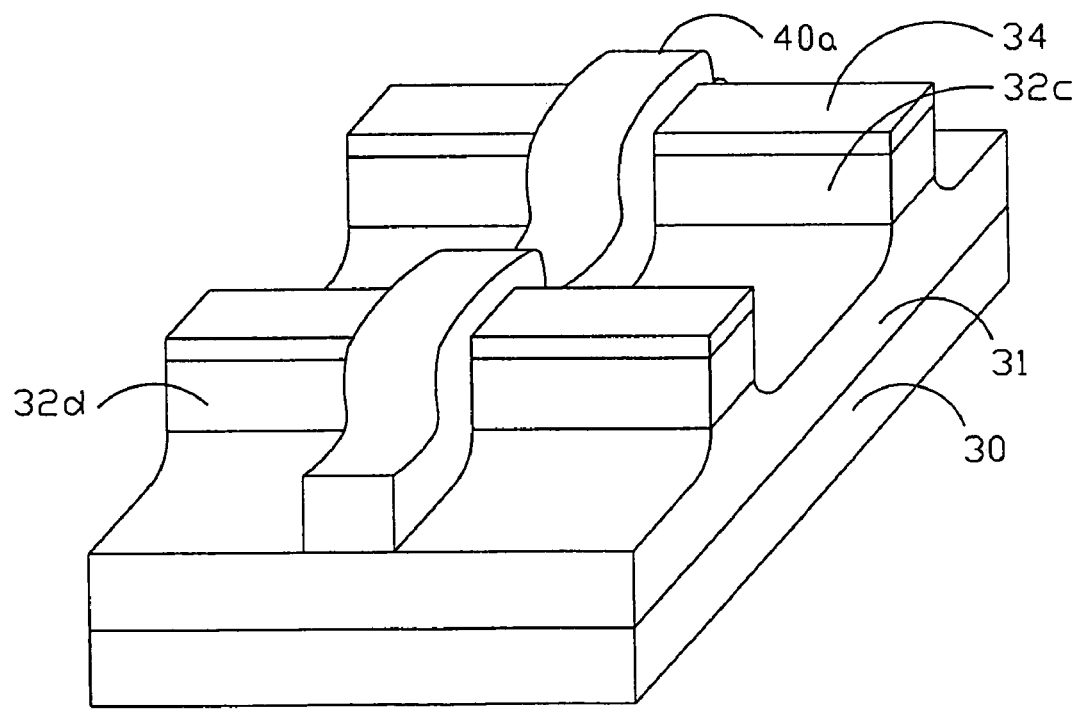
FIG. 4 is a schematic partial perspective view of the double gate CMOS devices of FIG. 3.

Referring now to the drawing of FIG. 4, which illustrates a schematic partial perspective view of a double gate MOSFET device provided by the present invention. In the present invention, the double gate MOSFET device is fabricated on an insulating layer, for example, a buried oxide layer (BOX) 31, overlying a semiconductor substrate 30, and includes a silicon source region 32c and a silicon drain region 32d connected by a silicon fin or channel. Hence, the double gate MOSFET device includes FinFET transistors. The source region 32c, drain region 32d and the channel are covered by a cap oxide layer 34. A gate 40a straddles the channel fin and perpendicular to the source region 32c and the drain region 32d and is isolated thereon by gate oxide and the cap oxide layer 34. Thus, inversion layers are formed on both vertical sidewalls of the channel. A recess structure is formed under each sidewall of the channel. The structure of the double gate MOSFET device has advantages of providing parallelly vertical double gates to effectively suppress the short channel effect and enhance drive current. The threshold voltage $V_{th}$ of the device can be controlled by adjusting the work function of the device controlling gate 40a, which is achieved by implanting desired dopants in the double gate 40a. A more uniformly distribution of implanted dopants in the gate 40a can be obtained due to the topography of the deposited gate material caused by the recess structure. Hence, a depletion of the gate 40a is prevented when operating the device.

Figure 1A:
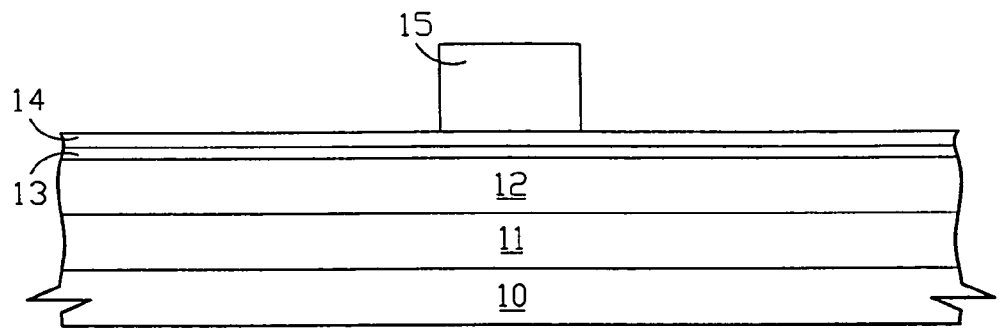
FIGS. 1A to 1F are cross-sectional views of a known FinFET transistor each of which corresponding to a different stage of fabricating the FinFET transistor.
Figure 1B:
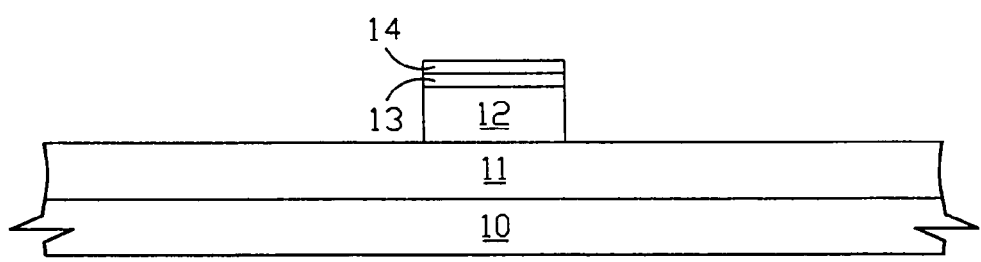
Figure 1C:
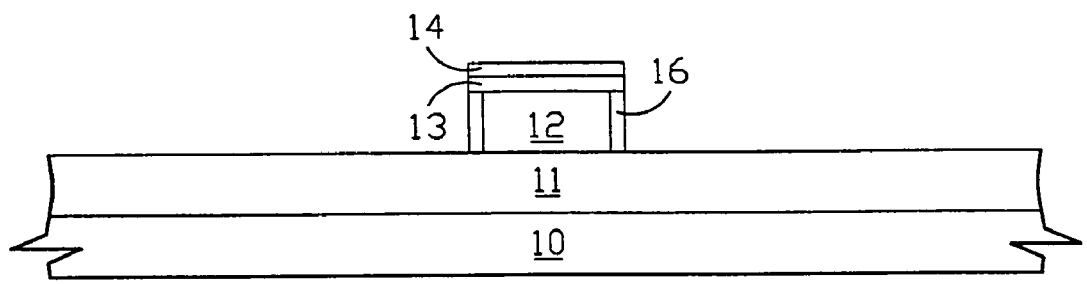
Figure 1D:
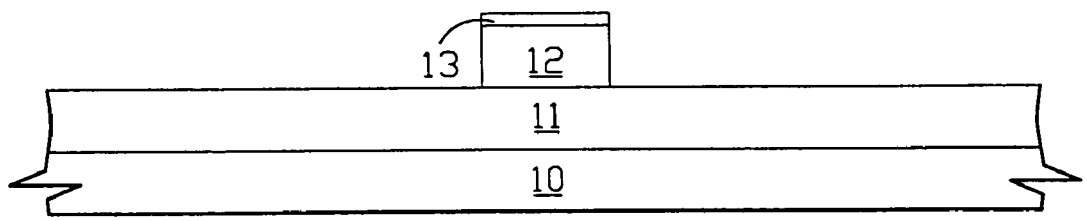
Figure 1E:
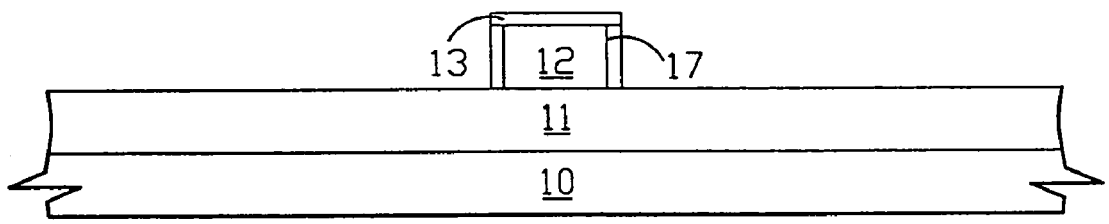
Figure 1F:
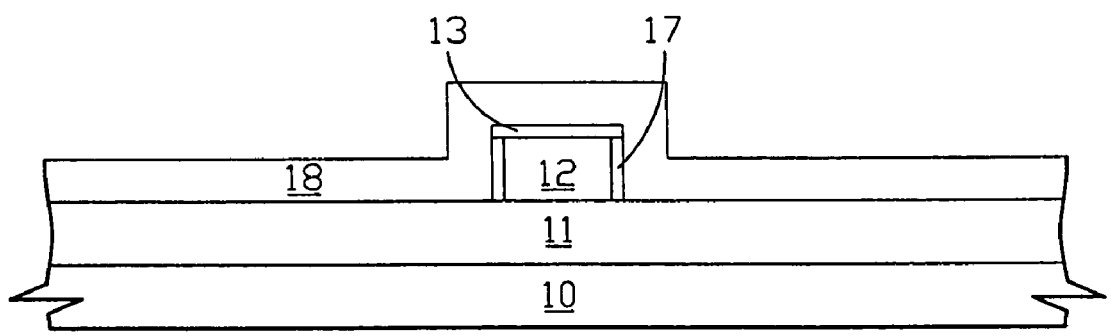
Figure 2:
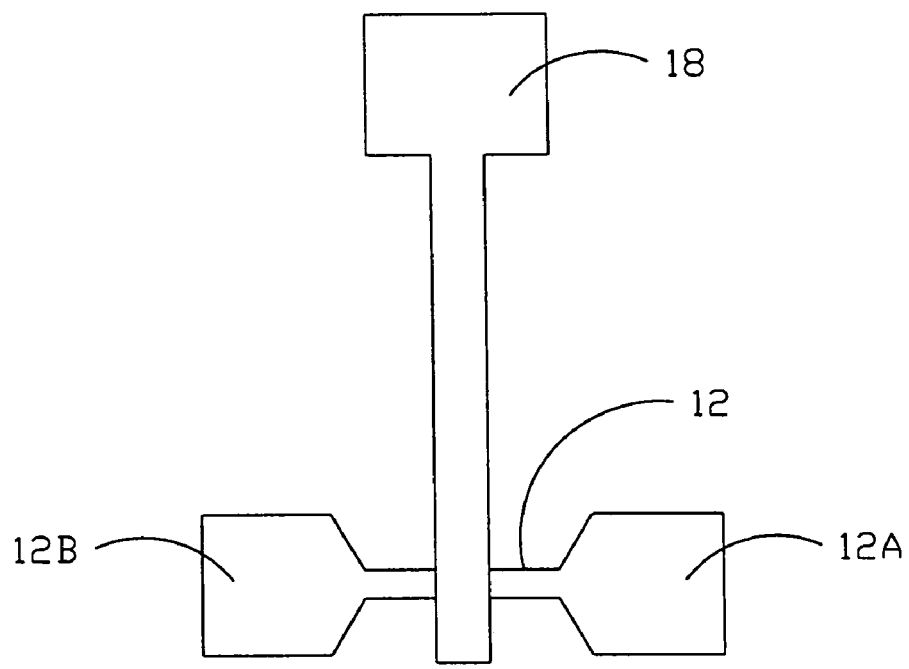
FIG. 2 is a schematic top view of the known FinFET Transistor.
Figure 3A:
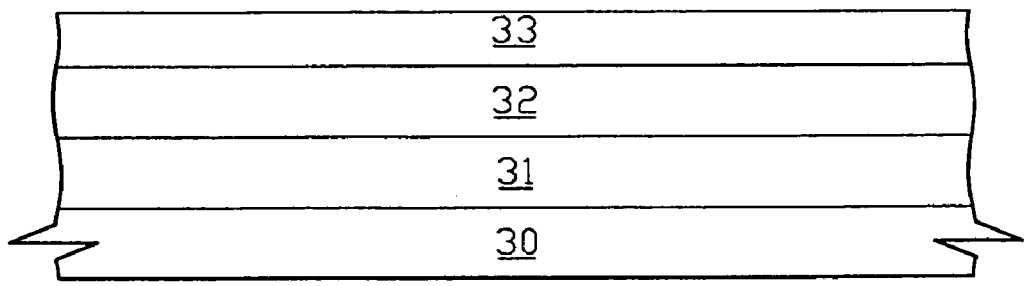
FIGS. 3A to 3J are cross-sectional views of a double gate CMOS device each of which corresponding to a different stage of fabricating the double gate CMOS device in accordance with one embodiment of the present invention.
Figure 3B:
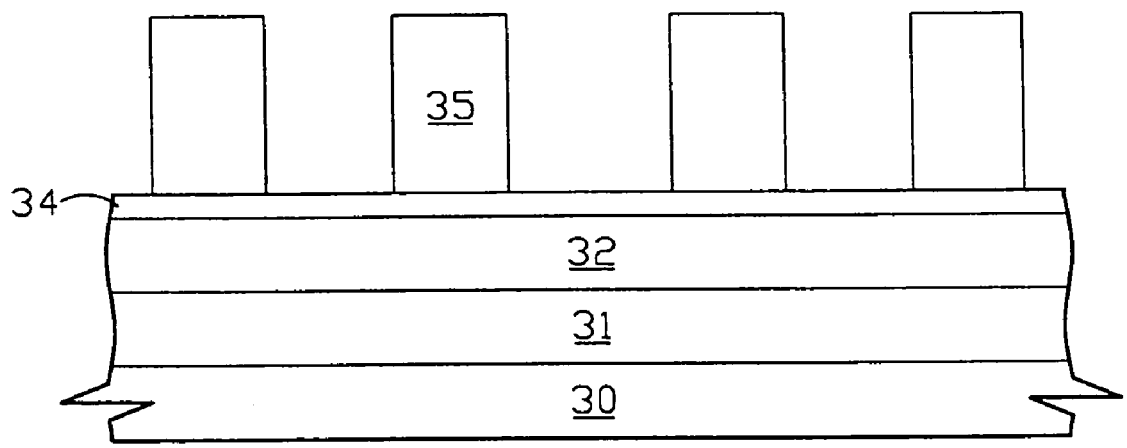
Figure 3C:
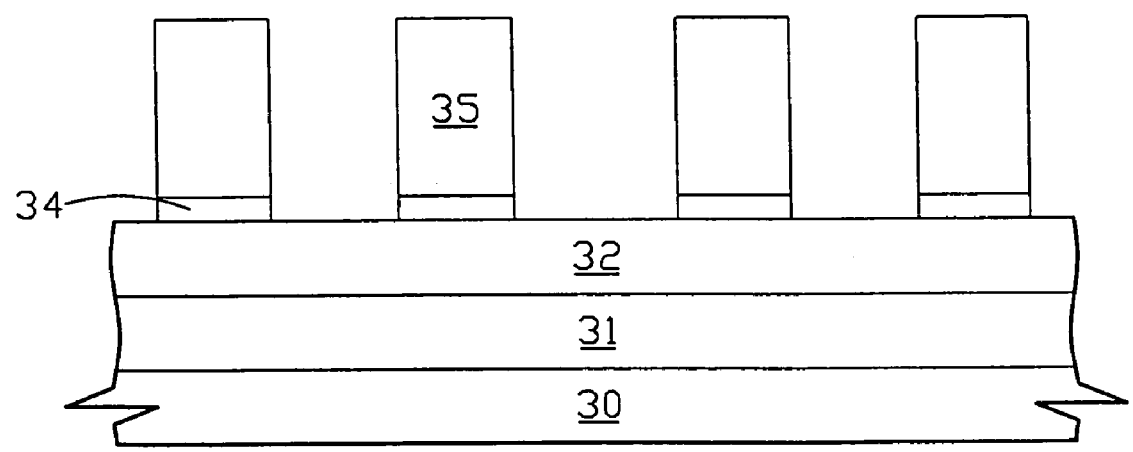
Figure 3D:
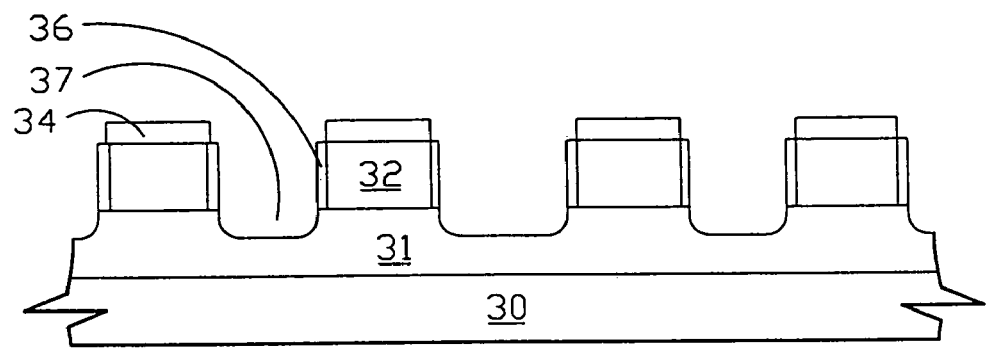

The FinFET transistors of the present invention can be fabricated on an insulating layer overlying a semiconductor substrate with a modified planar CMOS process. FIG. 3A to FIG. 3J is schematic cross sectional views illustrating steps in fabricating a double gate CMOS device according to one embodiment of the present invention. Referring to FIG. 3A, a substrate such as a silicon on insulator (SOI) structure is provided, including a silicon substrate 30, a buried oxide layer 31 and a silicon layer 32 on the buried oxide layer 31. The buried oxide layer (BOX) 31 has a thickness about 4000 angstroms, and the silicon layer 32 has a thickness about 2000 angstroms to 4000 angstroms. The silicon layer 32 is preferably a P type crystallized silicon layer on which FinFET transistors are formed and a resistance about 10~15 ohm-cm. A dopant, such as boron atom, with a dopant concentration about $1 \times 10^{15}/cm^3$, can be doped into the crystallized silicon layer to let it become the P type crystallized silicon layer. It is preferable to proceed a thermal oxidation to grow a thermal oxide layer 33 on the silicon layer 32 to thin it down to a thickness about 500 angstroms to 1200 angstroms. Subsequently, removing the thermal oxide layer 33 with buffered oxide etch (BOE). Referring to FIG. 3B, a cap oxide layer 34 with a thickness about 500 angstroms is finally grown on the silicon layer 32 by thermal oxidation. Then, a photoresistor layer 35 with a pattern defining source, drain and channel regions is provided on the cap oxide layer 34. Referring to FIG. 3C, using the photoresistor layer 35 as an etching mask and etching the cap oxide layer 34 with a reactive ion etching method to make the cap oxide layer 34 become a hard mask. Referring to FIG. 3D, removing the photoresistor layer 35. Then, using the cap oxide layer 34 as the hard mask, a reactive ion etching process is performed to over-etch the silicon layer 32 to form source regions (not shown), drain regions (not shown) and channels 32 extending from the buried oxide layer 31. For example, the silicon over-etching step can be performed until the buried oxide layer 31 is etched a depth about 250 angstroms or more. Hence, a recess 37 is formed under either side of the channel 32 in the buried oxide layer 31. The channel 32 is a fin structure with a top surface and two opposing sidewalls, and the recess 37 is formed in the buried oxide layer 31 under each opposing sidewall of the fin structure. The channel fin is connected between the source region and drain region (both are not shown in the drawing). Both the source region and drain region is perpendicular to the two opposing, sidewalls of the channel 32. Moreover, a wet etching process can be proceeded following the reactive ion etching process to let the recess 37 deeply form under each of the two opposing sidewalls of the channel 32 in the buried oxide layer 31. Thereafter, a sacrificial silicon ($SiO_2$) is formed along the two opposing sidewalls of the channel 32. For example, a sacrificial oxide ($SiO_2$) 36 having a thickness about 50 angstroms can be formed along the two opposing sidewalls of the channel 32 by an in-situ steam generation (ISSG) method at a temperature about 850° C.

Figure 3E:
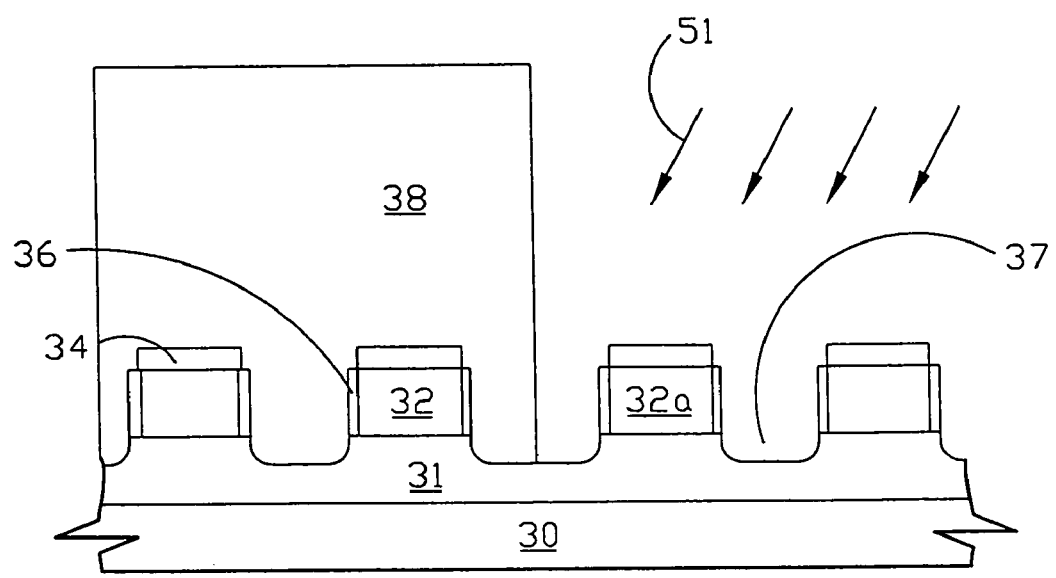
Figure 3F:
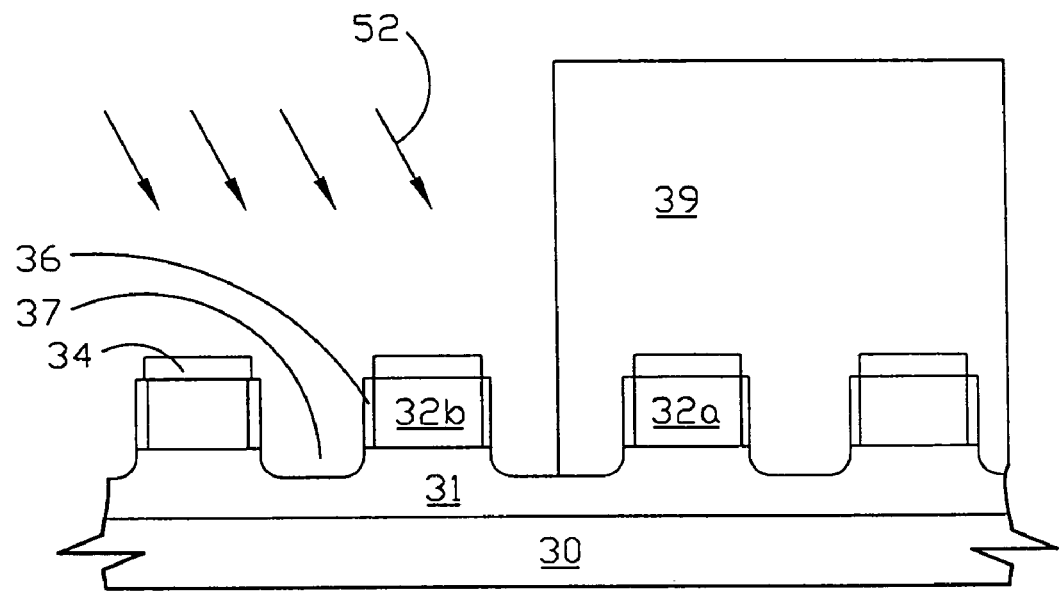

Referring to FIG. 3E, a photoresistor layer 38 with a pattern defining active regions of double gate NMOS devices is provided on the Fin structure on the buried oxide layer 31. A first twisted (or inclined) ion implantation 51 is performed to implant dopants in the channel 32 of the double gate NMOS devices, to let the channel 32 become a channel fin 32a with P-type conductivity. The first twisted ion implantation 51 can be performed under the following conditions: boron atoms as an ion source, implanting energy about 20 KeV and a tilted angle sequentially rotated with about 45°, 135°, 225° and 315°. Afterward, removing the photoresistor layer 38. Referring to FIG. 3F, a photoresistor layer 39 with a pattern defining active regions of double gate PMOS devices is provided on the Fin structure on the buried oxide layer 31. A second twisted ion implantation 52 is performed to implant dopants in the channel 32 of the double gate PMOS devices, to let the channel 32 become a channel fin 32b with N-type conductivity. The second twisted ion implantation 52 can be performed under the following conditions: phosphorous atoms as an ion source, implanting energy about 10 KeV and a tilted angle sequentially rotated with about 45°, 135°, 225° and 315°. Thereafter, the photoresistor layer 39 is removed.

Figure 3G:
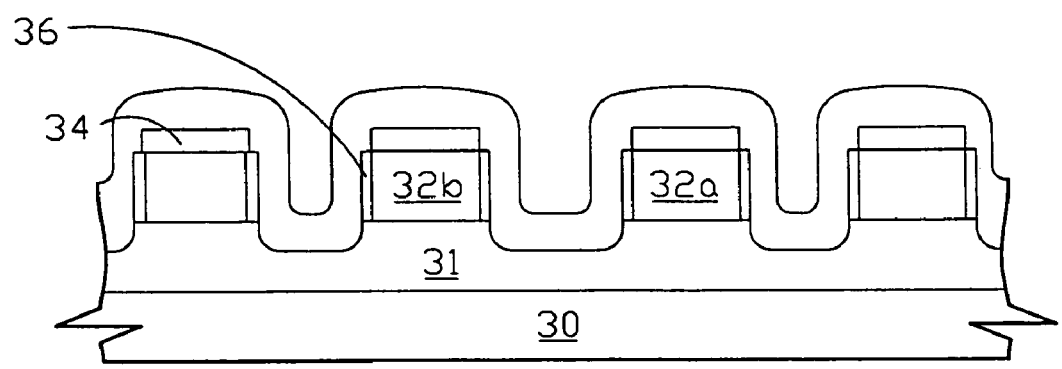
Figure 3H:
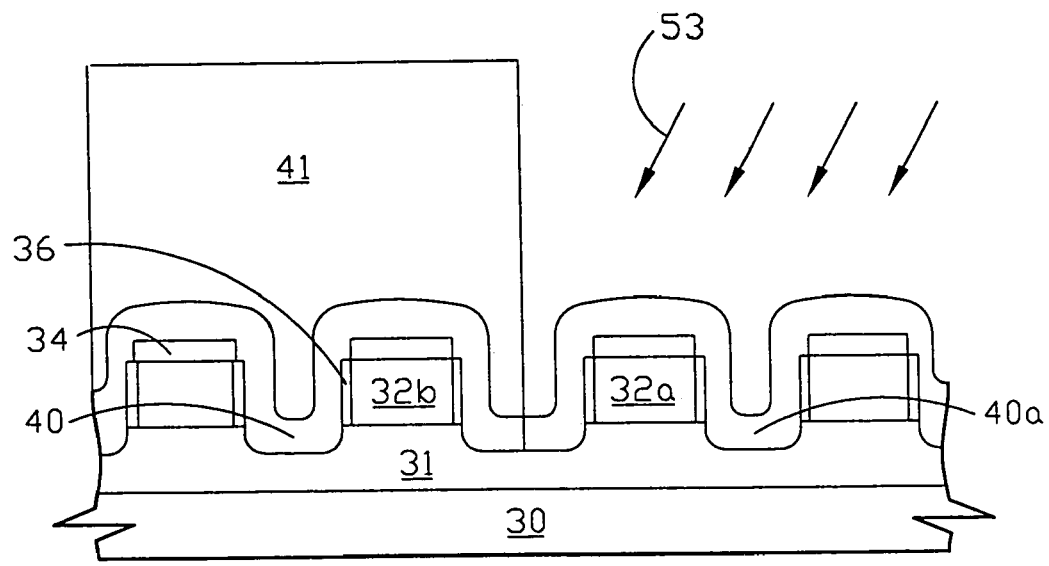
Figure 3I:
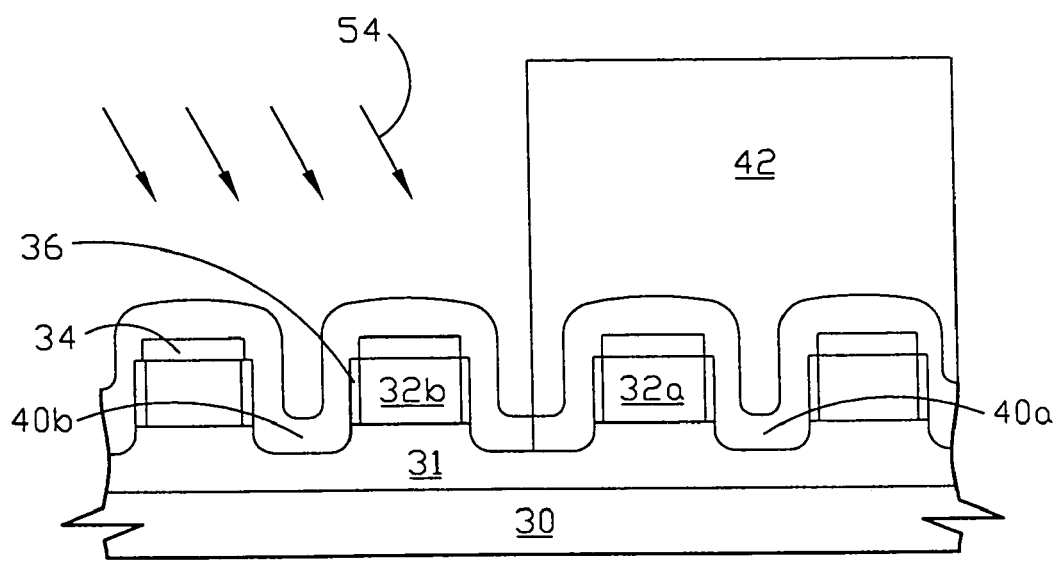
Figure 3J:
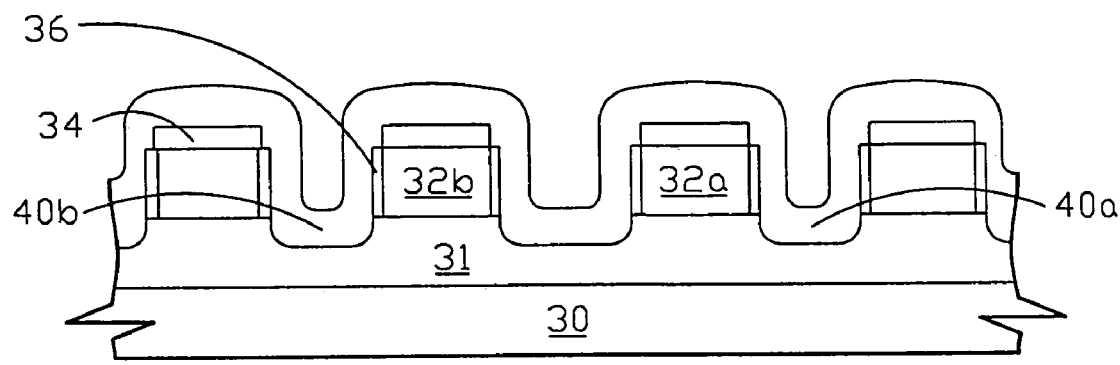

Referring to FIG. 3G, following, the sacrificial oxide 36 is removed with DHF ($HF/H_2O$) clean and a thin gate dielectric 36 is grown or deposited on all the vertical silicon sidewalls, following by the deposition of conductive gate layer 40. For example, a polysilicon layer 40 is deposited on the fin structure. The deposition thickness of the polysilicon layer 40 is properly controlled in order that the topography of the polysilicon layer 40 significantly deviates from a plain profile due to the structure of the recesses 37 under the channel fins 32a and 32b. Referring to FIG. 3H, a photoresistor layer 41 as an implanting mask to expose the region of the double gate NMOS devices is provided on the fin structure on the buried oxide layer 31. A third titled ion implantation is performed to implant dopants into the polysilicon layer 40 on the regions of the double gate NMOS devices to let the polysilicon layer 40 become a heavily doped $N^+$ polysilicon layer 40a. Then, removing the photoresistor layer 41. The topography of the polysilicon layer 40 on the fin structure on the buried oxide layer 31 significantly deviates from the plain profile, the third titled ion implantation would make the dopants easily implanted into the corner region contained between the gate dielectric 36 and the buried oxide layer 31. As a result, the heavily doped $N^+$ polysilicon layer 40a would have a more uniform distribution of dopants by using the 45° twisted (or tilted) ion implantation 53. Referring to FIG. 3I, a photoresistor layer 42 as an etching mask to expose the region of the double gate PMOS devices is provided on the fin structure on the buried oxide layer 31. A fourth titled ion implantation is performed to implant dopants into the polysilicon layer 40 on the regions of the double gate PMOS devices to let the polysilicon layer 40 become a heavily doped $P^+$ polysilicon layer 40b. Then, removing the photoresistor layer 42. The topography of the polysilicon layer 40 on the fin structure on the buried oxide layer 31 significantly deviates from the plain profile, the fourth titled ion implantation would make the dopants easily implanted into the corner region contained between the gate oxide 36 and the buried oxide layer 31. As a result, the heavily doped $P^+$ polysilicon layer 40b would have a more uniformly distribution of dopants by using the 45° twisted (or inclined) ion implantation 54. A rapid thermal annealing (RTA) process is proceeded by reflowing for about 20 seconds at a temperature of 850° C. to active dopants in the heavily doped $N^+$ polysilicon layer 40a and $P^+$ polysilicon layer 40b. Following, the heavily doped $N^+$ polysilicon layer 40a and $P^+$ polysilicon layer 40b are patterned to form double gates 40a straddling the channel fins 32a and 32b and perpendicular to the source regions 32c and drain regions 32d, as shown in FIG. 4. The source regions 32c and drain regions 32d of the NMOS device region and PMOS device regions are respectively implanted desired dopants to make them electrically conductive electrodes.

Referring to FIG. 3J again, the double gates of the NMOS device and PMOS device are respectively formed of heavily doped N+ polysilicon layer 40a and heavily doped P+ polysilicon layer 40b, both of which having a more uniform distribution of dopants provided by the present method. Therefore, when operating the device of the present invention, the problem of the depletion of polysilicon gate can be resolved, and the device driven-on currents can be further enhanced.

The embodiment is only used to illustrate the present invention, not intended to limit the scope thereof. Many modifications of the embodiment can be made without departing from the spirit of the present invention.

What is claimed is:

1. A double gate FinFET transistor device, comprising:
   a semiconductor substrate;
   a buried oxide layer on said semiconductor substrate, said buried oxide layer having a protrusive portion and a recess portion;
   a fin structure having two opposing sidewalls on said protrusive portion of said buried oxide, said fin structure being divided into a source region, a drain region, and a channel region located between said source and drain region;
   a gate dielectric layer on said two opposing sidewalls of said fin structure in said channel region; and
   a gate film including dopants, said gate film straddling on said fin structure in said channel region and extending to said recess portion of said buried oxide layer,
   wherein two surfaces of said two opposing sidewalls of said channel region of said fin structure extend smoothly to said buried oxide layer, such that said gate film along said two opposing sidewall of said channel region has a uniform dopant distribution.

2. A double gate FinFET transistor device according to claim 1, wherein said fin structure comprises silicon.

3. The double gate FinFET transistor device according to claim 1, further comprising a cap layer on said fin structure under said gate film.

4. The double gate FinFET transistor device according to claim 1, wherein said gate film comprises doped polysilicon.

* * * * *